United States Patent [19]

Kahnke

[11] Patent Number: 4,475,089

[45] Date of Patent: Oct. 2, 1984

[54] PROXIMITY DETECTOR

[75] Inventor: Joseph Kahnke, St. Paul, Minn.

[73] Assignee: Honeywell Inc., Minneapolis, Minn.

[21] Appl. No.: 363,997

[22] Filed: Mar. 31, 1982

[51] Int. Cl.³ .......................... G08B 13/24; H03B 9/14

[52] U.S. Cl. ........................................ 331/65; 331/96; 331/107 DP; 340/553; 340/686

[58] Field of Search .................... 331/65, 96, 107 DP; 307/116; 328/5; 340/552, 553, 686

[56] References Cited

U.S. PATENT DOCUMENTS

| | | | |
|---|---|---|---|
| 3,278,922 | 10/1966 | Andrews | 340/553 |
| 3,691,556 | 9/1972 | Bloice | 340/553 X |
| 4,001,718 | 1/1977 | Wilson et al. | 331/65 |
| 4,016,490 | 4/1977 | Weckenmann et al. | 324/61 R |
| 4,030,037 | 6/1977 | Tanaka et al. | 331/DIG. 3 X |
| 4,259,647 | 3/1981 | Chang et al. | 331/96 |
| 4,371,849 | 2/1983 | Longley | 331/107 DP X |

*Primary Examiner*—Eugene R. LaRoche
*Assistant Examiner*—Robert J. Pascal
*Attorney, Agent, or Firm*—Charles G. Mersereau

[57] ABSTRACT

A proximity detection system is disclosed including an oscillator circuit which has an electromagnetic resonator characterized by a hollow metallic chamber, an oscillator having negative resistance characteristics fixed in the chamber, and a source of direct current connected in series with the oscillator and the chamber. A radiating iris opening is provided in the chamber of a size and disposition such that oscillation of said oscillator circuit means is damped except in the proximate presence of an object before the iris. A detector responsive to a characteristic change in output in the oscillator circuit produced by the oscillation thereof such as an operational amplifier or comparator produces an output indicative of the presence of an object.

7 Claims, 1 Drawing Figure

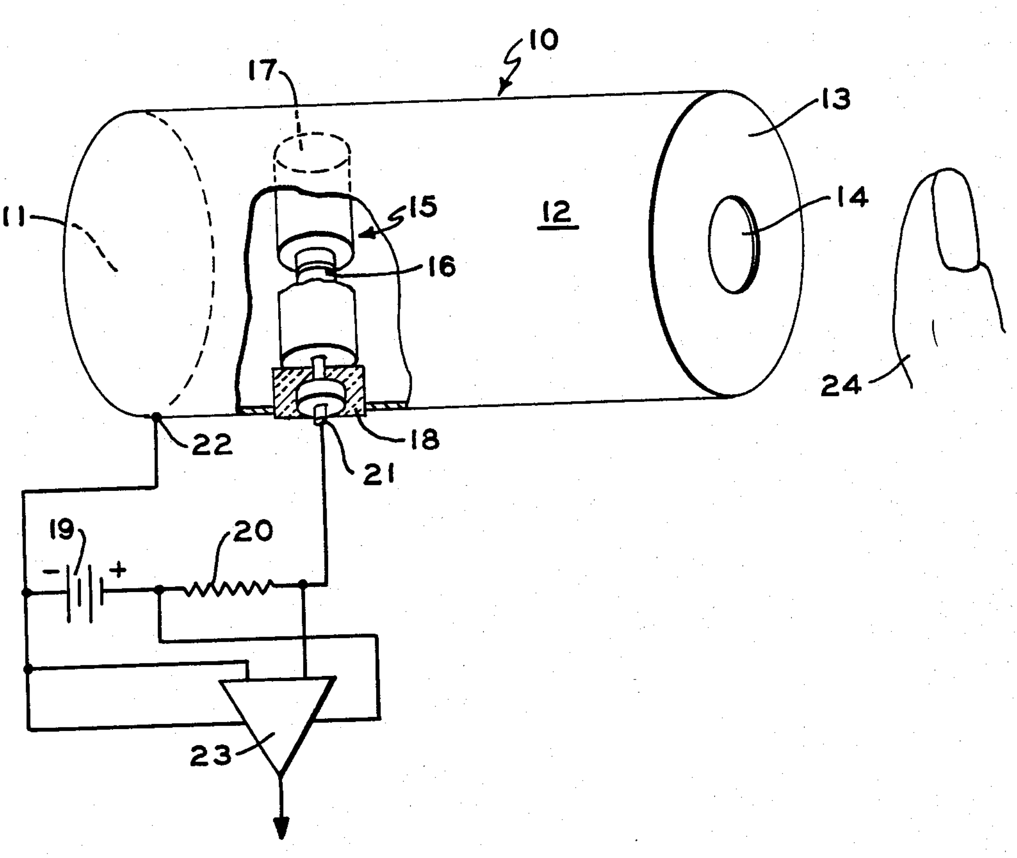
10
17
13
11
15
12
14
16
24
22
18
21
19
20
23

PROXIMITY DETECTOR

BACKGROUND OF THE INVENTION

1. Field of the Invention

The present invention relates to a proximity detector for sensing the presence of a conducting or other high dielectric object and, more particularly, to a proximity detector utilizing a negative resistance oscillator circuit in a manner in which oscillation occurs only in the presence of an object which can be sensed.

2. Description of the Prior Art

The prior art is replete with many types of proximity sensing devices. These include devices employing conventional oscillators wherein the oscillating condition of the oscillator in the proximity switch is changed somewhat by the electrostatic capacity produced by the approach of an object to be sensed. For example, the oscillator may be de-energized, its oscillation frequency changed or the like. Because of the operating characteristics of many of such systems, the signals produced by the approach of an object of interest are smaller than desired and often quite difficult to recognize without sophisticated circuitry associated with the device.

This reduces the reliability of the device or greatly increases the cost. One such device is illustrated and described in a patent to Tanaka et al, U.S. Pat. No. 4,030,037 issued June 14, 1977, which illustrates and describes a continuously oscillating system which detects the proximity of an object of interest such as, for example, a human body by a circuit imbalance which reverses the polarity of the input to a differential amplifier in the system. For some objects, however, the signal may be too weak to produce the required polarity reversal. Thus, there remains a need for a simple, low cost, sensitive proximity detecting device.

SUMMARY OF THE INVENTION

According to the present invention there is provided a simple, highly sensitive proximity detecting device which utilizes a hollow metallic electromagnetic resonator cavity or chamber in conjunction with a direct current negative resistance oscillator circuit. The oscillator circuit includes an oscillator having negative resistance characteristics which operates in conjunction with a radiating iris opening in the electromagnetic resonator chamber. The iris normally dampens oscillations in the circuit by coupling the resonator to the environment, but it allows reflection of energy back into the cavity when a metallic or high dielectric object approaches. This allows the circuit to begin oscillating. The negative resistance oscillator circuit is connected to a source of DC and includes an operational amplifier, comparator or similar detector having inputs connected across a series impedance device. The detector responds to a change in output of the oscillator circuit based on the proximity of an object of interest. The change is normally a drop in current in the circuit.

In the preferred embodiment the hollow metallic chamber is cylindrical in shape and the oscillator circuit includes a Gunn diode or other type negative resistance oscillator which is mounted in the chamber approximately one-quarter of the wavelength of the natural resonant frequency of the chamber from the closed end of the chamber and approximately one-half wavelength from the iris. The DC power supply is connected through a series resistor to the diode input and the diode output is connected to the resonant chamber. The detector is an operational amplifier or comparator connected across the series resistor. The input conductor to the diode traverses the chamber wall and is insulated from the chamber wall by a high dielectric material so that AC components in the circuit are by-passed to the cylinder.

BRIEF DESCRIPTION OF THE DRAWINGS

In the drawings, the single FIGURE is a partial perspective representation of the proximity detecting device of the present invention with parts cut away, including an electrical schematic.

DESCRIPTION OF THE PREFERRED EMBODIMENT

The FIGURE depicts the proximity sensing system of the invention and includes a hollow metallic cylindrical cavity 10 having an inner or closed end 11, sidewall 12 and outward directed or sensing end 13, which is provided with a central, substantially circular opening or iris 14. The cut away portion of the cylinder 10 shows a conducting member 15 having a section of reduced diameter in which is mounted a negative resistance oscillator means such as a Gunn diode, Baritt diode, or the like 16. The conductor 15 has one end 17 connected to the cylinder wall 12 while the other end protrudes through the cylinder wall and is insulated therefrom at 18. The insulation material is preferably one of high dielectric constant such that alternating current components in the conductor 15 may be by-passed through capacitive coupling by the insulating material to the cylinder wall 12 but it must be insulating to any DC components in the conductor 15.

The electrical circuit includes a source of direct current 19 which may be a battery or any conventional source such as one for converting AC to DC, connected in series with a resistor element 20, which, in turn, is connected to one end of the conductor 15 as at 21. The return circuit is connected from a point 22 on the cylinder 10 back to the source of the direct current. A detector 23, which may be an operational amplifier, comparator, or the like, has inputs connected across the resistor 20, as shown. An object of interest to be detected is illustrated as a human digit at 24.

The closed metallic chamber 10, as is the case with all such elements, is receptive to electromagnetic flux in a manner which causes it to be a natural resonator which resonates at a frequency related to its mass and dimensions. The oscillator element 15 of the circuit is receptive to such oscillations when mounted in the chamber and supplied with direct current. This produces current oscillations in the natural resonance of the chamber to which it is electrically connected because the diode is one having negative resistance characteristics such as a Gunn diode. The diode current and, thus, the current across the series load resistor 20 is high in the non-oscillating mode and drops substantially in the oscillation mode. The change in current amplitude is detected by the detector 23 which may be an operational amplifier connected as a comparator, a comparator or some other condition responsive device. The signal output can be used to operate a switch or in any other desired manner.

When the system is oscillating the associated primary electromagnetic wave output from the diode is reflected off the closed end 11 of the chamber 10. If the distance between the oscillator and the closed end 11 and the end 13 containing the iris 14 are properly selected secondary resonator coupling will occur and output will be maximized at the iris. If the iris is unobstructed, the output will be coupled to the outside environment. This heavily loads the resonator creating a condition which damps or inhibits oscillation in the system. When an object capable of reflecting the radiating energy back into the cavity appears close to and at least partially obscures, the iris, energy reflected back into the cavity thereby permits buildup of oscillation. A successful device has an ideal oscillator to end plate distance of one-quarter wavelength and an oscillator to iris distance of one-half wavelength. Of course, other relative distances which produce like resonator coupling in the secondary may be selected.

The proximity detection device of the present invention will readily detect the proximity of any conductor or high dielectric material such as glass, etc. Material of very low dielectric constant, such as some plastics, for example, however, may not reflect sufficient energy to allow oscillation of the system and be detectable by it.

The embodiments of the invention in which an exclusive property or right is claimed are defined as follows:

1. A proximity detector comprising:
an oscillator circuit means, said oscillator circuit means further comprising:
an electromagnetic resonator characterized by a closed hollow metallic cylindrical chamber;
an oscillator means having negative resistance characteristics disposed in said chamber;
impedance element connected in series with said oscillator means; and
a source of direct current connected in series with said oscillator means and said chamber;
a radiating iris opening in one end of said chamber wherein said iris is of a size and disposition such that oscillation of said oscillator circuit means is damped except in the proximate presence of an object before said iris; and
detector means having input terminals connected across said impedance element responsive to a characteristic change in output in said oscillator circuit means produced by the oscillation thereof.

2. The apparatus according to claim 1 wherein said detector means is an operational amplifier.

3. The apparatus according to claim 1 wherein said detector means is a comparator.

4. The apparatus according to claim 1 wherein said oscillator means is a Gunn diode.

5. The apparatus according to claim 1 wherein said oscillator means is a Baritt diode.

6. The apparatus of claim 1 wherein said oscillator means is fixed in said chamber and has an output connected to said chamber and an input insulated from said chamber by a material having a high dielectric constant such that AC components are by-passed to said chamber.

7. A proximity detector comprising:
an oscillator circuit means, said oscillator circuit means further comprising:
an electromagnetic resonator characterized by a closed hollow metallic cylindrical chamber;
an oscillator means having negative resistance characteristics disposed in said chamber; and
a source of direct current connected in series with said oscillator means and said chamber;
a radiating iris opening in one end of said chamber wherein said iris is of a size and disposition such that oscillation of said oscillator circuit means is damped except in the proximate presence of an object before said iris; and
detector means responsive to a characteristic change in output in said oscillator circuit means produced by the oscillation thereof; and
wherein the length of said resonant cavity is approximately equal to the three-fourths of the wavelength of the natural resonating frequency thereof, and wherein said oscillator means is located at a distance approximately one-fourth of said wavelength from the closed end of said cavity.

* * * * *